(12) United States Patent
Ishida et al.

(10) Patent No.: US 7,898,263 B2
(45) Date of Patent: Mar. 1, 2011

(54) ONBOARD BATTERY MANAGEMENT DEVICE

(75) Inventors: Koroku Ishida, Sado (JP); Sumio Homma, Sado (JP); Shigeki Homma, legal representative, Sado (JP); Toshiko Homma, legal representative, Sado (JP); Futao Kaneko, Niigata (JP); Takahiro Kawakami, Niigata (JP)

(73) Assignee: PCN Corporation, Niigata (JP)

( * ) Notice: Subject to any disclaimer, the term of this patent is extended or adjusted under 35 U.S.C. 154(b) by 792 days.

(21) Appl. No.: 11/886,901

(22) PCT Filed: Mar. 28, 2006

(86) PCT No.: PCT/JP2006/306319
§ 371 (c)(1),
(2), (4) Date: Oct. 29, 2007

(87) PCT Pub. No.: WO2006/106681
PCT Pub. Date: Oct. 12, 2006

(65) Prior Publication Data
US 2009/0051364 A1   Feb. 26, 2009

(30) Foreign Application Priority Data
Mar. 30, 2005 (JP) ............................. 2005-096795
Mar. 17, 2006 (JP) ............................. 2006-073760

(51) Int. Cl.
*G01N 27/416* (2006.01)
(52) U.S. Cl. .................. 324/430; 324/426; 320/132
(58) Field of Classification Search .................. 320/132; 324/426–436
See application file for complete search history.

(56) References Cited
U.S. PATENT DOCUMENTS
3,997,834 A * 12/1976 Winter et al. ............... 324/427
(Continued)

FOREIGN PATENT DOCUMENTS
JP    58-144278    * 9/1983
(Continued)

OTHER PUBLICATIONS
English translation of JP 58-144278, Inventor: Inoue.et.al, 1982.*
(Continued)

*Primary Examiner*—Edward Tso
*Assistant Examiner*—Samuel Berhanu
(74) *Attorney, Agent, or Firm*—Sughrue Mion, PLLC

(57) ABSTRACT

A battery management device is provided for accurately measuring in a simple manner the internal resistance (reciprocal of conductance) of a battery that serves as the determination reference of the deterioration level of a battery without the application of an AC voltage to the battery while the battery remains onboard, and determining and displaying the deterioration level of the onboard battery. The onboard battery management device has sensors 2 and 3 for measuring terminal voltage and current of an onboard battery 1; a computation processor 6 for determining the deterioration level of a battery (as well as for calculating and determining the internal resistance on the basis of the measured value); and a display unit 7 of the battery state, wherein the internal resistance is determined based on an AC voltage component and an AC electric current component that are calculated by performing differential processing or subtractive processing on the voltage value and electric current value of the onboard battery during engine operation measured without the application of an AC signal from a sensor terminal; and the DC component, the low-frequency component, and the high-frequency component are removed using a filter circuit to determine the deterioration level.

6 Claims, 4 Drawing Sheets

U.S. PATENT DOCUMENTS

| | | | |
|---|---|---|---|
| 4,937,528 A * | 6/1990 | Palanisamy | 324/430 |
| 6,359,442 B1 * | 3/2002 | Henningson et al. | 324/426 |
| 2001/0033169 A1 * | 10/2001 | Singh et al. | 324/426 |
| 2004/0222797 A1 * | 11/2004 | Palanisamy et al. | 324/426 |

FOREIGN PATENT DOCUMENTS

| JP | 10-92475 A | 4/1998 |
|---|---|---|
| JP | 2001-228222 A | 8/2001 |
| JP | 2001-228226 A | 8/2001 |
| JP | 2002-221559 A | 8/2002 |
| JP | 2004-14231 A | 1/2004 |
| JP | 2004-301780 A | 10/2004 |
| JP | 2004-301785 A | 10/2004 |
| JP | 2005-77128 A | 3/2005 |

OTHER PUBLICATIONS

Microfilm of the specification and drawings annexed to the request of Japanese Utility Model Application No. 39379/1982 (Laid-open No. 144278/1983)(Nissan Motor Co., Ltd) Sep. 28, 1983.*

* cited by examiner ated to a management device
provided with deterioration level determination means of an
onboard battery.

BACKGROUND ART

Deterioration level of a battery (lead storage battery) is
known to be determined by measuring the internal resistance
of a battery (ohmic resistance component, activation polarization
component, and concentration polarization).

For example, Japanese Laid-Open Patent Application No.
2001-228226 (Patent Document 1) discloses, as deterioration
level determination means that measures the internal resistance
of a battery, a process that is based on the fact that
internal resistance varies depending on temperature as well as
the charged state in which the open circuit voltage is measured;
the charged state is calculated based on data from the
open circuit voltage; the internal resistance of the battery
during nonuse and the internal resistance when the battery has
deteriorated and can no longer be used is calculated based on
the charged state-resistance characteristics data; the internal
resistance of the two is furthermore temperature corrected;
the internal resistance is calculated based on the correlative
relationship between the electric current and voltage when a
target battery is discharging, and the deterioration level of the
battery is calculated from the internal resistances thus calculated.

Calculation means that uses actual measurements of the
internal resistance determines the internal resistance at the
time of measurement based on data sampled in advance on the
basis of change in the discharge current and reduced voltage
of the battery. However, there is a problem in terms of cost to
record a large amount of data and to perform all of the prescribed
comparative conversion processing using onboard
equipment.

In view of the above, Japanese Laid-Open Patent Application
No. 2002-221559 (Patent Document 2) discloses a management
device that determines the deterioration level of a
battery in order to eliminate the inconvenience of making a
special trip to a service station or automobile maintenance
facility to determine the deterioration level of a battery.

Japanese Laid-Open Patent Application No. 2002-221559
(Patent Document 2) discloses means that has a battery, a
computer that computes the battery characteristics from the
terminal voltage and the discharge current of the battery, a
determination unit that determines the battery deterioration
level state on the basis of the battery characteristics and the
battery fluid temperature, and a cranking determination unit
that determines that the internal combustion engine starter
apparatus is cranking, wherein the battery deterioration level
state is determined during cranking.

[Patent Document 1] Japanese Laid-Open Patent Application No. 2001-228226
[Patent Document 2] Japanese Laid-Open Patent Application No. 2001-228226

DISCLOSURE OF THE INVENTION

Problems the Invention is Intended to Solve

The measurement determination means of the internal
resistance of Patent Documents 1 and 2 sample the discharge
current and the terminal voltage of the battery after a prescribed
length of time has elapsed from the sampling time of
each, and calculates the internal resistance from the value of
the discharge current and the value of the terminal voltage
between the differing times.

Measurement is preferably carried out in a state in which
there is no effect of the other loads of the vehicle (the transient
phenomenon of lagging loads and leading loads) in order to
determine the deterioration level of an onboard battery. In
conventional means, the characteristics data in a state in
which the battery is not under a load (onboard state) is gathered
in advance, and the internal resistance and other factors
are determined by a laborious method in that computation is
performed based on the data.

In actual measurements, the sampling values (DC current
value and DC voltage value) obtained in states that are readily
susceptible to load fluctuations are adopted without any
modifications, and the deterioration level is determined based
solely on the internal resistance obtained by measuring the
direct current. Therefore, the determination means of the
internal resistance, which a prerequisite for determination,
lacks precision.

Measuring the internal conductance of a battery as means
for determining the deterioration level is known to improve
the accuracy in comparison with measuring DC resistance,
but the device as such is made complex in order to apply AC
voltage to an onboard battery and measure the internal resistance
(reciprocal of conductance).

In view of the above, the present invention proposes, first,
a management device that extracts the AC component of
charging and discharging electric current when the engine is
operating and calculates the internal resistance (reciprocal of
conductance) from the AC component to determine the deterioration
level, and second, an onboard battery management
device that determines the deterioration level on the basis of
measurements of the internal resistance at engine startup.

Means for Solving these Problems

The onboard battery management device of the present
invention is characterized in having sensors for measuring
terminal voltage and terminal current of an onboard battery; a
computation processor for calculating and determining internal
resistance on the basis of the measured value and determining
the deterioration level of a battery; and a display unit
of the battery state provided in a viewable location from the
driver's seat, wherein the configuration is one in which the
internal resistance is determined based on an AC voltage
component and an AC electric current component that are
calculated by performing differential processing and subtractive
processing on the voltage value and electric current value
of the onboard battery during engine operation measured at
prescribed cycles (sampling several times per second to several
thousand times per second) without the application of an
AC signal from a sensor terminal; and the internal resistance
is converted to the internal resistance, i.e., static resistance
value, prior to engine startup when the battery is not operating
using a conversion formula established in advance based on
data, is furthermore converted to cold cranking amperage that
is based on the static resistance value, and the deterioration
level of the battery is determined based on the cold cranking
amperage.

The onboard battery management device of the present
invention (second aspect) is characterized in having, in the
same manner as the above-described battery management
device, prescribed sensors, computation processor, and a display
unit, wherein the configuration is one in which the terminal voltage value and the terminal electric current value of the onboard battery are measured during engine operation without the application of an AC signal from a sensor terminal, and the low-frequency component and high frequency component are removed using a filter circuit to determine the internal resistance based on a specified AC voltage component and an AC electric current component, and the internal resistance is converted to the internal resistance, i.e., static resistance, prior to engine startup when the battery is not operating using a conversion formula established in advance based on data, is furthermore converted to cold cranking amperage that is based on the static resistance value, and the deterioration level of the battery is determined based on the cold cranking amperage.

The battery is charged by an engine-driven generator when the vehicle is traveling (the engine is operating). The terminal voltage of the battery at this time is the sum of the battery-generated voltage and product of the internal resistance and the charging electric current. (Since terminal voltage of the battery when the battery is discharging is the difference between the battery-generated voltage and the product of the internal resistance and the charging electric current, the computation processing can naturally be performed based on the direction of the current.) Since the terminal voltage and terminal electric current pulsate, sampling is carried out in prescribed cycles (sufficient cycles required to extract an AC component that can be used to calculate a reliable internal resistance value), the sampling value is subjected to differential or subtractive processing (processing that calculates the amount of change and removes the DC portion), the AC portion of the terminal voltage and charging electric current is extracted, and alternatively, the low frequency component and the high frequency component are removed using a filter circuit to specify the AC voltage component and the AC electric current component. The internal resistance (dynamic resistance: reciprocal of dynamic conductance) is calculated during battery operation from the AC voltage component and the AC electric current component, and the amount of deterioration of the battery is determined based on the data ascertained in advance from the dynamic resistance value.

Specifically, CCAx is calculated using the conversion factor of the cold cranking amperage (CCA) from the static resistance value and the conversion formula of the dynamic and static resistance values (internal resistance value when the battery is not operating prior to engine startup: reciprocal of the static conductance) ascertained as data in advance. The amount of deterioration of the battery is determined based on the CCAi (CCA when shipped from the factory) in accordance with JIS specification, and this value is displayed. The determination reference of the battery deterioration level may naturally be established from the dynamic internal resistance using another method.

On this particular point, the present invention is advantageous as a management device because an AC signal from a sensor terminal is not applied, but rather voltage that includes the AC component from the onboard generator is applied to the battery and other loads to calculate the internal resistance (dynamic resistance) by using the AC voltage and AC electric current components, the internal state of the battery can therefore be ascertained without consideration for the DC voltage of the battery, and the charging time when the vehicle is traveling is considerable for the particular case in which the calculation is based on the charging electric current.

The present invention (third aspect) is one in which the internal resistance is determined based on an AC voltage component and an AC electric current component that are specified by subjecting a voltage value and electric current value of the onboard battery in particular to differential processing or subtractive processing, and determining the AC voltage component and the AC electric current component, at which time the DC component and low frequency component of several hertz or less are removed, and smoothing is used to remove a higher-frequency component equal to or greater than the engine speed or half the sampling frequency. In other words, the DC component, the low-frequency component of several hertz or less, the high frequency noise component from the presumed sampling, and the components (the components that are known to be noise components) that are equal to or greater than the engine speed are removed so as to eliminate the effect of the direct current and noise portions, and to make it possible for the internal resistance value to be reliably calculated using the AC voltage component and the AC electric current component.

Furthermore, with the present invention (fourth aspect) the voltage value and electric current value of the onboard battery are measured without the application of voltage from a sensor terminal when the engine is rotating in particular, the measured values are passed through a band pass filter circuit or a high-pass filter circuit, whereby a DC component and a low frequency component of several hertz or lower are removed, and a high frequency component of the engine speed or higher is removed by using a low-pass filter circuit, whereby the internal resistance value can be reliably calculated based on a low-noise AC voltage component and AC electric current component.

The onboard battery management device of the present invention (fifth aspect) is characterized in having, in the same manner as the above-described battery management device, a voltage sensor and a electric current sensor, a computation processor, and a display unit, wherein the configuration is one in which the internal resistance (dynamic resistance) of the battery is calculated based on voltage decrease due to starter drive current during vehicle engine startup, and the internal resistance is converted to the internal resistance, i.e., static resistance, prior to engine startup when the battery is not operating using a conversion formula established in advance based on data, is furthermore converted to cold cranking amperage that is based on the static resistance value, and the deterioration level of the battery is determined based on the cold cranking amperage.

Therefore, when the vehicle engine is started, the internal resistance is calculated by using the voltage decrease at the time of startup from the heavy electric current of starter driving and the battery terminal voltage before and after starter driving, and the deterioration level is thereby determined. The decrease in voltage due to internal resistance can be clearly ascertained in order to measure the heavy electric current during startup in particular. The measuring and determination timing occurs only during engine startup, and when the single-trip travel time of the vehicle is considered, there is little tendency for deterioration to occur during travel to require battery replacement. Therefore, the device is sufficiently practical in providing a deterioration determination and display function even when used to make a determination during startup only.

EFFECT OF THE INVENTION

The present invention, having the above-described configuration, provides a battery management device that is suitable for mounting in a vehicle because the internal resistance, which determines the deterioration level of a battery, can be accurately measured in a simple manner.

BEST MODE FOR CARRYING OUT THE INVENTION

The first embodiment of the present invention will be described next. The basic configuration of the device overall is essentially the same as a conventional device, and is composed of a voltage sensor 2 that measures the terminal voltage of an onboard battery 1, an electric current sensor 3 that measures the battery terminal electric current, and a temperature sensor 4 that measures the battery temperature, wherein the measured values are converted by an A/D converter circuit 5, prescribed computational processing is carried out by a computation processor (microcomputer) 6 to determine the charged state and deterioration level of a battery, and the determination result is displayed by a display unit 7.

The voltage sensor 2 is directly connected or connected via a voltage divider to the A/D converter circuit 5 together with the other end of the later-described electric current sensor 3 that is connected to a terminal of battery 1, and the voltage of the battery 1 is ascertained by using the electric potential difference with the body ground terminal connected to the A/D converter circuit 5.

The electric current sensor 3 inputs to the A/D converter circuit 5 a terminal voltage (potential drop of a low-resistance resistor) of the low-resistance resistor using a low-resistance resistor connected in series with the terminal of a battery 1. The low-resistance resistor may be manufactured using Manganin, which is known as a precision low-resistance resistor. Specifically, rolled material composed of Manganin (e.g., Cu 86%, Mn12%, Ni2% (wt %)) machined to a prescribed shape is inserted between pure copper plates, and the two ends are welded by electron beam welding and then trimmed (ground). A material is adopted having a resistance of 30 mΩ or less (preferably 0.1 mΩ) and a low thermo-electromotive force in relation to copper (0.2 µV/° C. or less). The effect of heat in the boundary between the pure copper leads and the Manganin resistor is reduced to the maximum possible extent.

The temperature sensor 4 is configured to use platinum resistance disposed in the vicinity of the surface of the battery 1 or the voltage sensor 2 and electric current sensor 3 in order to calculate the battery temperature from the resistance value (the drop in electric potential of the platinum resistance) of the platinum resistance.

A commercially available IC can be used as the A/D converter circuit 5 without any modifications, and a higher performance IC (a commercially available 1,875 Hz IC is adopted as an embodiment) is preferred.

The computation processor (microcomputer) 6 computes the output data of the A/D converter circuit 5 in a prescribed processing sequence, compares the processing result and a determination reference value determined in advance, and provides a display signal output to the display unit 7. The processing sequence is described in detail below.

The display unit 7 displays Suitable, Caution (charging required), and Dangerous (charging essential) in relation to the current charged state of the battery, and displays Good, Caution, and Dangerous in relation to the deterioration level of the battery. The display means displays characters or lights colored indicator lights (e.g., blue, yellow, and red).

The first computation processing of the computation processor 6 is to determine the charged state of the battery, and the terminal voltage value of the battery is an index of the state of the battery. Therefore, the temperature correction of the voltage value is performed to calculate the voltage value at the reference temperature, and the charged state is determined by comparing the resulting numerical value and the determination reference value.

The second embodiment of the present invention will be described next. The basic configuration of the device overall is essentially the same as a conventional device and the device of the first embodiment, and the measured values detected by the voltage sensor 2 and the electric current sensor 3 is passed through filter circuits, i.e., the filter circuits 21 and 31, and an amplifier, and thereafter converted in the A/D converter circuit 5. A computation processor 6a carries out prescribed computational processing to calculate the internal resistance of the battery and determine the deterioration level. The determination results are displayed on the display unit 7. With the second embodiment, there is an advantage in that the deterioration level can be determined without performing complicated differential processing or subtractive processing.

The determination reference of the charging state of the battery will be described next. It is known that the charging state of the battery is proportional to the specific gravity of the electrolytic solution (see the graph of FIG. 5), the specific gravity of the electrolytic solution fluctuates due to temperature, and conversion to the specific gravity of the electrolytic solution at the reference temperature (20° C.) can be carried out using the formula "Specific gravity of electrolytic solution at reference temperature=Specific gravity of electrolytic solution at current temperature+0.0007 (current temperature −20)."

Based on the constant-current discharge characteristics of a battery, the voltage decreases in proportion to the discharge time from the voltage when the battery is fully charged (approximately equal to 12.75 V) to about 11.2 V, and rapidly decreases thereafter. Therefore, assuming that 12.75 V corresponds to a 100% charged state and that 11.2 V is 0%, and based on the graph of the charging capacity and the specific gravity of the electrolytic solution (FIG. 5), the formula "Reference temperature voltage Current voltage+0.0007 (Current temperature ° C.−20° C.)" can roughly be obtained when the specific gravity of the electrolytic solution and the battery voltage are compared and a temperature-correcting formula for the specific gravity of the electrolytic solution is adopted.

In view of the above, the determination reference value (design value) to be displayed is selected so that, as long as the temperature correction value of the battery voltage is at a prescribed voltage or higher (12.38 V or higher: 77% fully charged or higher), voltage within a specific range (12.38 to 12.25 V: 69% charged or higher) is determined to be a at caution level, and voltage at a prescribed value or lower (12.25V or less) is determined to be within the warning range. Determination means 61 based on this value is incorporated into the computation processor 6, and the determination result is outputted to the display unit 7.

Next, a second processing of the computation processor 6 is carried out to determine the deterioration level of a battery. Therefore, internal resistance (dynamic resistance) is used as and index of the deterioration level of the battery. The present invention in particular features the use of a technique for ascertaining the internal resistance (dynamic resistance).

Measurement and calculation are carried out based on the charging electric current during battery charging when the vehicle is traveling (the engine is operating) and on the battery voltage at the aforementioned time, and the charging voltage applied to the battery depends on the engine-driven generator and includes the AC component. In view of this fact, the voltage and electric current values of the determination results are temporally differentiated at prescribed cycles to remove the DC voltage portion and the DC current portion and calculate the AC voltage component and the AC current component when the signal output from the voltage sensor 2 is in a fixed direction (charging direction).

Specifically, the processing entails calculating (voltage differentiating means 62 and electric current differentiating means 63) the variation between the previous measurement values and the measurement values of the voltage and electric current values measured at prescribed cycles in correspondence to the dynamic timing in the A/D converter circuit 5 (IHM-A-1500 driven at 1,875 Hz, manufactured by Isabellenhütte, Germany), and averaging (over five measurement cycles) the difference so as to calculate (remove the noise) the AC voltage component value and the AC current component value. The values are converted from the averaged values to absolute values (converted to absolute values because the a single cycle is 0 even when the AC waveform is integrated), and the sum of the absolute values of the AC voltage and the AC electric current in prescribed measurement units is calculated to obtain a dynamic resistance value by dividing the sum (resistance calculating means 64).

As another method, the voltage and electric current values may be divided at the time of each measurement from the values obtained during the previous measurement to obtain the difference, and the average in prescribed measurement units of the absolute values of the division results is obtained to calculate the internal resistance.

In the particular case that a high-performance system (high resolution: a high-frequency system provided with a prescribed amplitude function) is adopted as the A/D converter circuit 5 in the above-described calculation, the ascertainment of the difference is made even more precise, and the AC voltage component and AC current component can be reliably extracted in a simple manner.

The calculation results described above are determined based on a prescribed determination reference (determination means 61), and the determination results of the deterioration level of the battery are displayed on the display unit 7.

The determination method of the battery deterioration level described above will be described next. The rate of change in the cold cranking amperage is used as the method for determining the battery deterioration level. In other words, JIS specification (JIS D5301) describes cold cranking amperage (often referred to as CCA) as a measure of engine startup performance of a lead storage battery for an automobile. The CCA is referred to as the electric current value 30 seconds after the voltage has reached 7.2 V (1.2 V per cell) when a constant electric current is discharged at −18° C.

In view of this fact, the battery rankings of various manufacturers was confirmed, wherein an experimental charging and discharging device was used to repeatedly and forcibly charge and discharge a battery to cause deterioration, the static resistance (the internal resistance of the battery prior to engine startup) of the battery was measured using a conductance measuring device (manufactured by Midtronics, USA), and the CCA was measured at the same time using a CCA measurement device (manufactured by Midtronics). As a result, the relationship between the static resistance value and the CCA was confirmed to be a proportional relationship, i.e., "CCAx≈0.6×1/(static resistance value)."

The CCAi at the time of shipment from the manufacturer of a battery serves as a determination of the deterioration level (SOH) of a battery and is established as a JIS specification. For example, CCAi=279A at 34B17L. In view of this fact, when the battery deterioration level is "SOH %=(1−CCAx/CCAi)×100," the management reference (management setting value) was experimentally confirmed to be good for the following levels: suitable when SOH is 30% or less, caution when SOH is 30 to 40%, and dangerous when SOH is 40% or higher.

A difference was furthermore found between the static resistance value prior to engine startup and the dynamic resistance value that is measured for the same battery at engine startup, during travel, and at other times for a battery that has deteriorated (dead battery) and been recharged in the vehicle traveling state as an onboard state of a battery.

As a result of the above, a relationship such as that shown in the graph of FIG. 6 is obtained when the relationship between the static resistance value measured prior to engine startup and the dynamic resistance value calculated based on the AC component described above is observed.

Therefore, the DC voltage component and the DC current component are removed from the measurement data, i.e., the voltage value and electric current value, the AC voltage component and AC current component are extracted to calculate the dynamic resistance value, and the resulting value is converted to a static resistance value using a conversion formula (FIG. 6). The deterioration level is calculated, the result of the calculation is compared with the management reference, the determination result is output to the display unit 7, and prescribed display is carried out.

The first embodiment described above does not required a more complicated device because the dynamic resistance of a battery is calculated using the AC component in the voltage and electric current during battery charging (when the engine is driving), the dynamic resistance thus calculated is sequentially converted to static resistance and a deterioration level to determine the state (deterioration level) of the battery, and the result is then displayed. Since the battery DC voltage, which essentially varies by a considerable amount during engine startup and operation, is not taken into consideration, a large capacity memory is not required for the computation processing, and since the processing entails calculation and conversion of the resistance value based on the AC component, a simple comparison is made with the internal resistance calculated based on the voltage and electric current values thus measured. The determination of the dynamic resistance value that corresponds to the state of deterioration can be more reliably carried out. Also, calculation based on the AC component described above is performed without adding an AC signal from the exterior, and there is an advantage in that the apparatus does not need to be made more complex.

The present invention is not limited by the AC component extraction means described in the embodiment above, and the measurement values may be processed by fast Fourier transformation (FFT) to directly obtain the AC voltage component and the AC current component on the basis of a specific frequency or a specific band frequency.

The third embodiment of the present invention will be described next. The configuration of the third embodiment is the same as the first embodiment in being composed of a voltage sensor 2 that measures the terminal voltage of an onboard battery 1, an electric current sensor 3 that measures the battery terminal electric current, a temperature sensor 4 that measures the battery temperature, an A/D converter circuit 5 in which measurement values undergo A/D conversion, a computation processor (microcomputer) 6 that determines the charged state of the battery and the level of deterioration, and a display unit 7 for displaying the determination results. The processing method of the computation processor 6b is different than that of the first embodiment.

The computation processor 6b of the third embodiment is the same as that of the first embodiment in terms of the determination means 61 of the battery charging capacitance, but differs in terms of the calculation means for the dynamic resistance, which is the basic factor for determining the deterioration level. Specifically, the DC voltage and DC current are measured when a heavy current flows during vehicle engine startup, and the dynamic resistance is calculated (by calculation means 65) based on the resulting measurement to obtain data for determining the battery deterioration level.

When the vehicle is started, the initial voltage of the battery is measured, and the internal resistance (dynamic resistance) of the battery is calculated (=(Initial voltage −Instantaneous minimum voltage ÷Instantaneous maximum voltage)) from the battery voltage value (instantaneous minimum voltage value) at startup and the maximum value (instantaneous maximum electric current value) of the starter drive current when the ignition switch is turned on.

The relationship between the dynamic resistance calculated as described above and the static resistance measured prior to engine startup is shown in the graph of FIG. 6, and a correlation relationship (conversion formula) between the two is apparent. Therefore, the dynamic resistance value thus calculated is converted to a static resistance by using the conversion formula, the CCA is furthermore calculated from the static resistance value, the SOH is obtained, a prescribed determination is made from the SOH calculation result, and the determination results are displayed on the display unit 7.

The initial voltage value and the instantaneous minimum voltage value are preferably corrected for temperature when the dynamic resistance is calculated.

In the embodiments of the present invention in particular, an ultra-precise low-resistance resistor having a resistance of 30 mΩ or less (preferably 0.1 mΩ or less) is used as the electric current sensor. Therefore, the sensor terminal voltage is 150 mV (in the case of 0.1 mΩ) even when a heavy current of 1,500 A occurs at startup. When a charging or discharging current of 300 A flows during normal vehicle travel, a voltage of 30 mV (in the case of 0.1 mΩ) is generated, and input to the A/D converter circuit 5 is sufficiently and reliably carried out. The sampling voltage of the voltage sensor naturally may be set in an optimal voltage range by using a voltage divider circuit.

KEY

Figure 1:
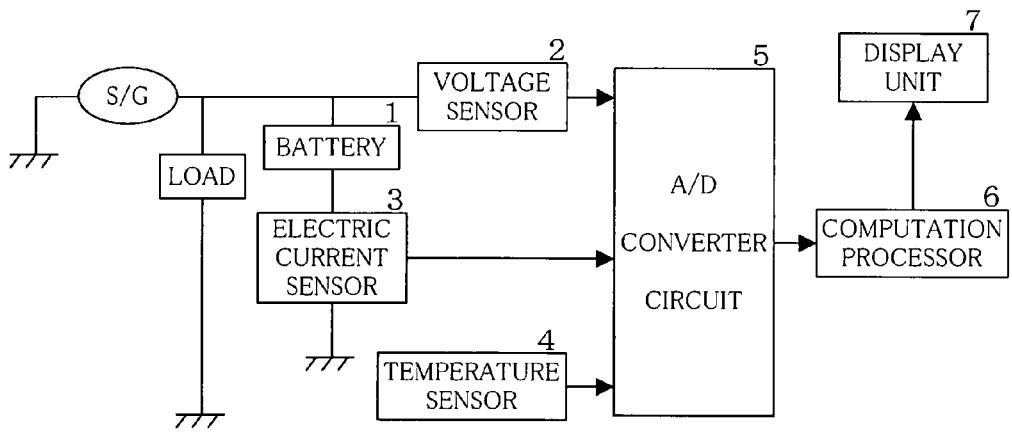
FIG. 1 is an overall block diagram of an embodiment of the present invention.
Figure 2:
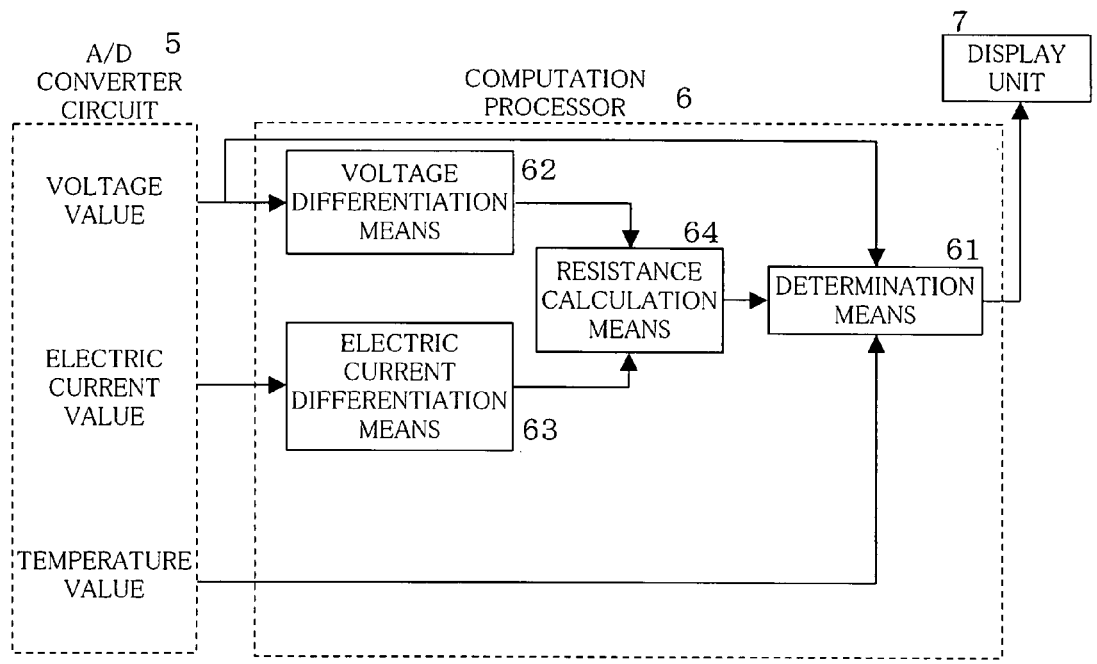
FIG. 2 is a schematic diagram of the computation processor of the first embodiment.
Figure 3:
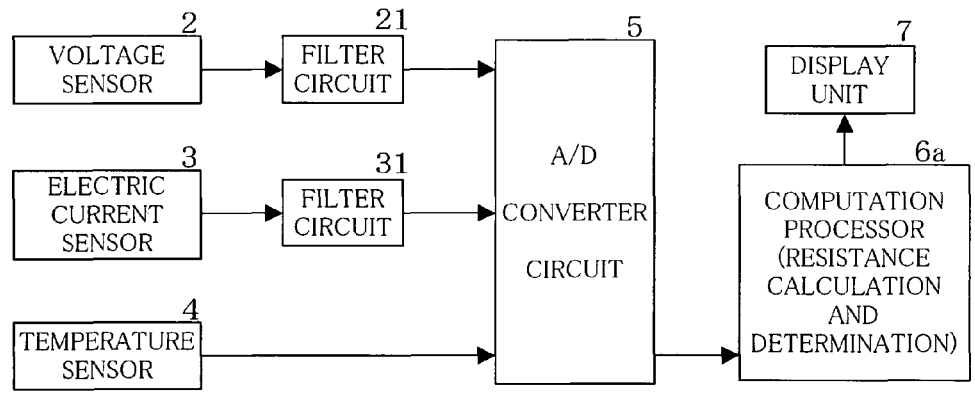
FIG. 3 is a schematic diagram of the computation processor of the second embodiment.
Figure 4:
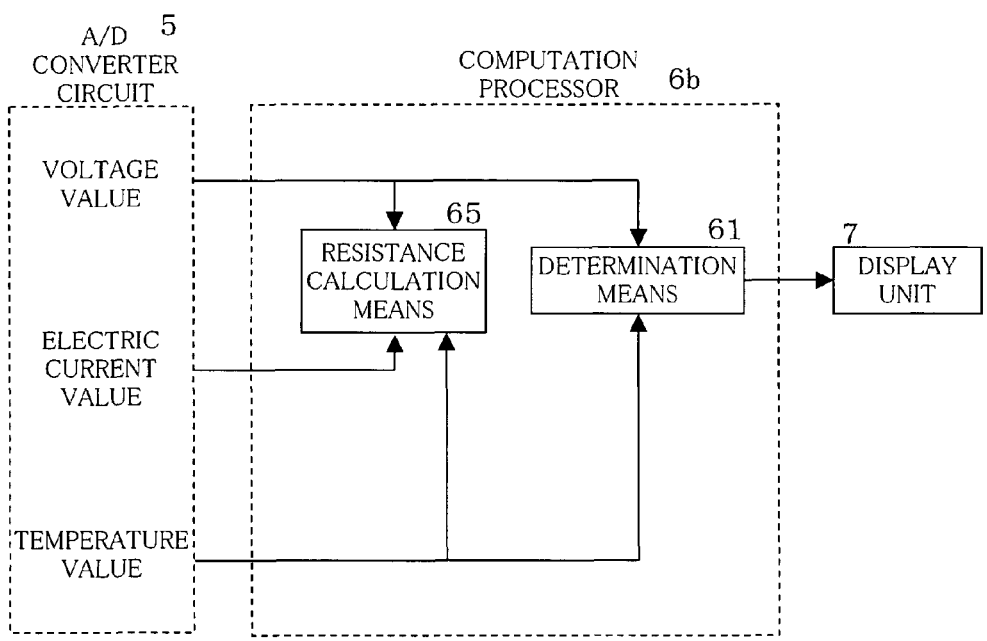
FIG. 4 is a schematic diagram of the computation processor of the third embodiment.
Figure 5:
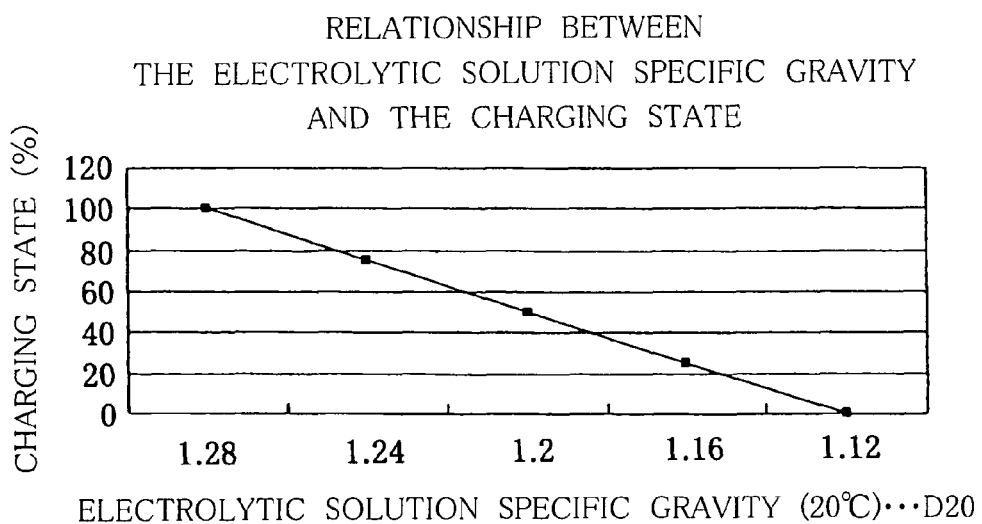
FIG. 5 is graph showing the relationship between the specific gravity of the electrolytic solution and the charging capacitance.
Figure 6:
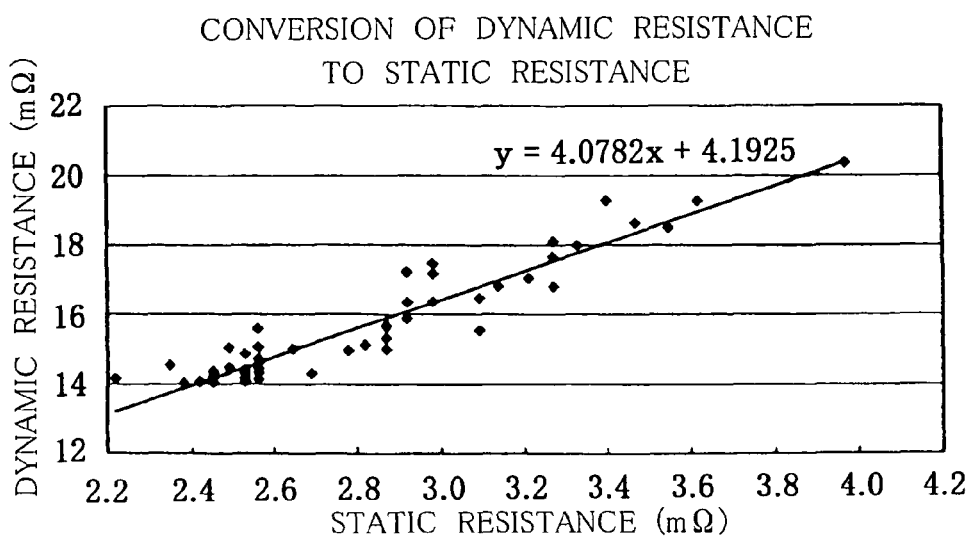
FIG. 6 is a graph showing the relationship between the dynamic resistance and the static resistance of the first embodiment.
Figure 7:
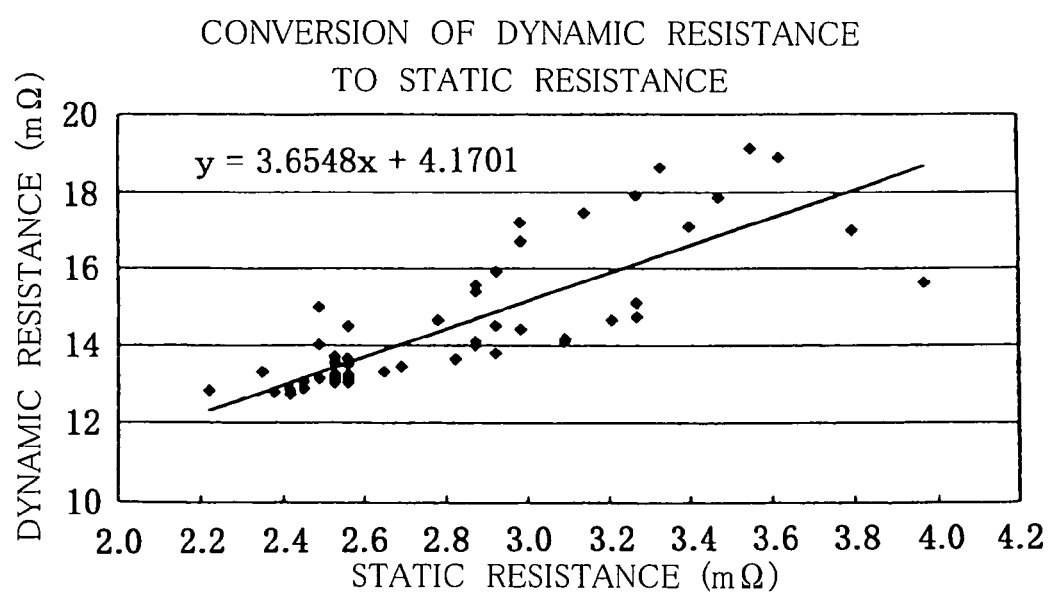
FIG. 7 is a graph showing the relationship between the dynamic resistance and the static resistance of the third embodiment.

1 Onboard battery
2 Voltage sensor
3 Electric current sensor
4 Temperature sensor
5 A/D converter circuit
6, 6a, 6b Computation processor
7 Display unit
21 Filter circuit
31 Filter circuit

The invention claimed is:

1. An onboard battery management device for managing the deterioration level of an onboard battery during engine operation, the device comprising:
   sensors for measuring terminal voltage and terminal current of an onboard battery;
   a computation processor for calculating and determining internal resistance on the basis of said measured value and determining the deterioration level of a battery; and
   a display unit of the battery state provided in a viewable location from the driver's seat, wherein
   the internal resistance is determined based on an AC voltage component and an AC electric current component that are calculated by performing differential processing and subtractive processing on the voltage value and electric current value of the onboard battery during engine operation measured by sampling several times per second to several thousand times per second without the application of an AC signal from a sensor terminal during engine operation; and
   the internal resistance is converter to static resistance value using a conversation formula established in advance based on data, wherein the static resistance value is battery resistance value prior to engine start up; and calculating cold cranking amperage from the static resistance value, and the deterioration level of the battery is determined based on the cold cranking amperage.

2. An onboard battery management device for managing the deterioration level of an onboard battery during engine operation, the device comprising:
   sensors for measuring terminal voltage and terminal current of an onboard battery;
   a computation processor for calculating and determining internal resistance on the basis of said measured value and determining the deterioration level of a battery; and
   a display unit of the battery state provided in a viewable location from the driver's seat, wherein
   the internal resistance is determined based on an AC voltage component and an AC electric current component that are specified by passing a voltage value and electric current value of the onboard battery at the time of engine startup through a filter circuit to remove a low frequency component and a high frequency component without the application of an AC signal from a sensor terminal during engine operation; and
   the internal resistance is converter to static resistance value using a conversation formula established in advance based on data, wherein the static resistance value is battery resistance value prior to engine start up; and calculating cold cranking amperage from the static resistance value, and the deterioration level of the battery is determined based on the cold cranking amperage.

3. The onboard battery management device according to claim 1, wherein differential processing or subtractive processing is performed while the voltage value and the electric current value of the onboard battery are measured during engine operation, a low frequency component at a prescribed level or lower is removed, and a high frequency component at a prescribed level or higher is removed by smoothing to determine the internal resistance based on a specified AC voltage component and an AC electric current component.

4. The onboard battery management device according to claim 2, wherein the voltage value and the electric current value of the onboard battery are measured during engine operation while being passed through a band pass filter circuit or a high-pass filter circuit, whereby a DC component and a low frequency component of several hertz or lower are removed, and a high frequency component at a prescribed level or higher is removed by a low-pass filter circuit to determine the internal resistance on the basis of a specified AC voltage component and AC electric current component.

5. An onboard battery management device for managing the deterioration level of an onboard battery during engine operation, the device comprising:

sensors for measuring terminal voltage and terminal current of an onboard battery;

a computation processor for calculating internal resistance on the basis of said measured value, and determining the deterioration level of a battery; and a display unit of the battery state provided in a viewable location from the driver's seat, wherein the internal resistance is converter to static resistance value using a conversation formula established in advance based on data, wherein the static resistance value is battery resistance value prior to engine start up; and calculating cold cranking amperage from the static resistance value, and the deterioration level of the battery is determined based on the cold cranking amperage.

6. The onboard battery management device according to any of claims 1 through 5, comprising temperature sensors, wherein the charging state of the battery during engine operation is determined by the generated voltage of the temperature-corrected battery, and an onboard battery charging state display function for displaying the charging state is provided.

* * * * *

UNITED STATES PATENT AND TRADEMARK OFFICE
CERTIFICATE OF CORRECTION

PATENT NO. : 7,898,263 B2
APPLICATION NO. : 11/886901
DATED : March 1, 2011
INVENTOR(S) : Koroku Ishida et al.

It is certified that error appears in the above-identified patent and that said Letters Patent is hereby corrected as shown below:

Column 5, line 65, before "state" insert --charged--;
Column 6, line 37, after "voltage" (first occurrence) insert --≈--;
Col. 10, line 28, Claim 1, line 20, change "is converter to" to --is converted to a--;
Col. 10, line 29, Claim 1, line 21, change "conversation" to --conversion--;
Col. 10, line 31, Claim 1, line 23, before "battery" insert --a--;
Col. 10, line 31, Claim 1, line 23, change "start up" to --starting--;
Col. 10, line 52, Claim 2, line 19, change "converter to" to --converted to a--;
Col. 10, line 53, Claim 2, line 20, change "conversation" to --conversion--;
Col. 10, line 55, Claim 2, line 22, before "battery" insert --a--;
Col. 10, line 55, Claim 2, line 22, change "start up" to --starting--;
Col. 12, line 4, Claim 5, line 11, delete "is converter to", and after "resistance" insert --of the battery is calculated and determined based on voltage that has decreased due to drive current and starter drive current during vehicle startup, and the internal resistance is converted to a--;
Col. 12, line 5, Claim 5, line 12, change "conversation" to --conversion--;
Col. 12, line 7, Claim 5, line 14, change "start up" to --starting--.

Signed and Sealed this
Twentieth Day of September, 2011

David J. Kappos
*Director of the United States Patent and Trademark Office*